United States Patent [19]

Fineman et al.

[11] 4,353,778

[45] Oct. 12, 1982

[54] METHOD OF ETCHING POLYIMIDE

[75] Inventors: Jonathan P. Fineman, Alburg; Leonard A. Kieny, Jr., Shelburne, both of Vt.

[73] Assignee: International Business Machines Corporation, Armonk, N.Y.

[21] Appl. No.: 299,370

[22] Filed: Sep. 4, 1981

[51] Int. Cl.$^3$ .................... B29C 17/08; C03C 15/00; C03C 25/06

[52] U.S. Cl. .................. 156/644; 156/651; 156/655; 156/659.1; 156/668; 430/316; 430/317

[58] Field of Search ............... 156/644, 638, 650–653, 156/654, 655, 659.1, 668; 252/79.5; 430/316, 317; 427/88–91

[56] References Cited

U.S. PATENT DOCUMENTS

| | | | |
|---|---|---|---|
| 3,767,493 | 10/1973 | Kump | 156/17 |
| 4,113,550 | 9/1978 | Saiki et al. | 156/656 |
| 4,152,195 | 5/1979 | Bährle et al. | 156/656 |

OTHER PUBLICATIONS

*IBM Technical Disclosure Bulletin*, vol. 20, No. 2, Jul. 1977, p. 525+, "Flash Etch Technique for Polyimide Insulated Double Metal Contact", H. C. Cook, J. S. Kristoff and C. J. Hamel.

*IBM Technical Disclosure Bulletin*, vol. 14, No. 9, Feb. 1972, p. 2607, "Etching Technique for Minimum Undercutting", by L. M. Elijah, R. M. Esposito, A. Phillips and A. V. S. Satya.

*Primary Examiner*—William A. Powell
*Attorney, Agent, or Firm*—William N. Hogg

[57] ABSTRACT

In etching openings in polyimide film, the film is first etched with a basic reagent in its uncured or partially cured state to form the desired openings, and thereafter, the film is cured. However, this will leave a layer of disturbed material surrounding the openings which has absorbed some reagent and will not fully cure and, therefore, not provide topography suitable for reliable interconnection and metal adherence. This disturbed material is removed by a second etch in a basic reagent, following additional curing to a sufficient extent to prevent any etching of the polyimide free of absorbed etchant. Thereby, suitable topography and adherence is provided.

6 Claims, No Drawings

METHOD OF ETCHING POLYIMIDE

BACKGROUND OF THE INVENTION

This invention relates generally to the etching of polyimide material, and more particularly to a method of etching polyimide to provide a surface surrounding the etched areas which has topography suitable for reliable interconnection and metal adherence.

In many different processes it is necessary to provide a polyimide film with openings therein. For example, in the packaging of semiconductor chips polyimide films are often coated on substrates. In certain of these uses it is necessary to form openings in the polyimide coating to allow for electrical connections to be made between various levels of metallurgy. These openings, commonly referred to as vias, are conventionally formed by etching the polyimide with a strong basic reagent in the areas where polyimide is to be removed to form the vias. However, it is necessary to perform this etching with the polyimide in an uncured or semi-cured state since fully cured polyimide will not react with strong bases. Therefore the conventional practice has been to apply a polyimide precursor, and then remove the solvent and partially cure applied material to form a polyimide. This partially cured film is then etched with a strong base to form the desired vias after which etching the film is fully cured. After the film is fully cured the necessary metal is deposited in the vias to afford contact with the underlying metal.

It has been found however, that there is a problem in obtaining proper continuity of the metal, through the vias. Upon investigation it has been discovered that when the partially cured polyimide is etched, there is a thin surface layer of polyimide material left at the walls of the via which has absorbed some of the etchant, but has not been removed. This absorbed etchant alters the ability of the polyimide to further cross-link such that it will not fully cure, but rather remain in a gel like consistency even after the curing cycle is completed which would normally fully cure the polyimide and which does fully cure the remainder of the polyimide film.

SUMMARY OF THE INVENTION

According to the present invention a method of etching a polyimide material is provided wherein the polyimide is first etched with a basic reagent in an uncured or semi-cured condition, resulting in a layer of material surrounding the etched region having absorbed some of the etchant. The polyimide is then additionally cured to a sufficient extent to prevent any etching of the polyimide free of absorbed etchant; and thereafter the etching operation is repeated using a basic reagent to remove the surface material containing the absorbed etchant. A final cure results in a via with topography suitable to provide reliable interconnection and metal adherence.

DESCRIPTION OF THE PREFERRED EMBODIMENT

The present invention will be described as it is practiced in manufacturing a substrate for mounting semiconductor chips. However, it is to be understood that its use is not so limited, but rather is applicable to other situations wherein polyimide materials have to be etched to form an opening or a pattern of openings and good fully cured surface material is required around the opening or openings in the final product.

In the formation of multilayer substrates for mounting chips one configuration requires an insulating substrate of a ceramic material on which is deposited a pattern of metallic conductors. Conventionally the conductors are three layers of metal the layers being a layer of chromium, a layer of copper and an overlying layer of chromium. On top of this metallized ceramic substrate is placed a film of polyimide and on top of the polyimide a second layer or pattern of conductors is applied, again normally a tri-metal layer of chromium-copper-chromium is deposited. It is necessary to electrically connect some of the conductors in the upper or second layer of metallization to some of the conductors in the lower or first layer of metallization. This invention is directed to a method of forming the vias in the polyimide material to allow for a metal connection between the upper and lower layers of metallization.

The first portion of the process of the present invention is conventional. The polyimide material is applied as polyamic acid in a solution of n-methyl-2-pyrrolidone. The pre-polymer solution is then partially cured, after which a photoresist is applied and by a standard photoresist technique, exposed to radiation and developed so as to allow the underlying polyimide to be exposed through the developed photoresist. Thereafter the underlying polyimide is etched with a strong base such as KOH to open the vias. Up to this point the process is the same as conventional prior art. After this initial etch according to the present invention the polyimide is again cured at a sufficiently high temperature for a sufficient amount of time such that the film is sufficiently cross-linked to resist attack by a strong base. However, as was indicated above, that curing will not cross-link the thin layers of material around the etched vias and these thin layers of material remain essentially in a gel like consistency which is not fully cured. The polyimide is again etched with a basic reagent. This second reagent, it has been found, removes this layer of material which was not previously removed during the first etching of the partially cured polyimide, but the basic reagent will not attack the remainder of the polyimide which has been additionally cured to a sufficient extent to prevent any etching of the polyimide free of absorbed etchant.

The above description describes in general terms the improved process of the invention. A specific and preferred embodiment for carrying out the present invention is as follows. After metallization is applied to a ceramic substrate by conventional techniques, polyimide prepolymer such as Dupont 5878 which is comprised of 16% solid polyamic acid in n-methyl-2-pyrrolidone is applied to a thickness of about 16 microns after first stage polyimide cure. This is preferably done by spraying with a solution that has a viscosity of about 15 poise. After the solution of polyimide prepolymer is applied, the substrate with the applied prepolymer has a first stage cure performed by heating for 15 minutes at 130° C. on a preheated hotplate. This is essentially a drying step to remove the solvent and initially start the curing of the polyimide. It is only a partial cure and does not cross-link the polyimide sufficiently to prevent it from being attacked by strong basic reagents. (As used herein the term partial cure means curing which is insufficient to cross-link the polyimide to such an extent that it will not be attacked by basic reagents).

After the first stage cure, photoresist is applied which is preferably KTFR manufactured by Eastman Kodak Co. of Rochester, N.Y. The resist is spray applied to a thickness of about 50,000 angstroms. The substrate with the applied polyimide and photoresist is then heated for 15 minutes at 85° C. in a preheated oven. This heating will not significantly advance the curing of the polyimide and it will still remain in a partially cure state. However, the photoresist will be hardened. After the photoresist has been hardened it is exposed through a conventional mask with patterns therein in the desired via pattern. A 200 watt mercury lamp is used for the exposure at a time of about 20 seconds.

Following the exposure of the photoresist it is developed in KTFR developer sold by Kodak, followed by a butyl acetate rinse and then a drying operation in nitrogen. A second stage baking is then performed which is done at 130° for 15 minutes on a preheated hotplate. This is to stabilize the profile of the developed resist around the via hole pattern. This also is not sufficient to significantly increase the curing of the polyimide and it still remains in the partially cured stage.

Following the photoresist pre-etch bake the exposed polyimide is etched in potassium hydroxide. A solution of 15 g/l of potassium hydroxide at 50° C. is used with an etching time of about 30 seconds. This will etch the vias at the exposed pattern. Following the etching a cold water rinse is applied followed by drying. Following this etch, the polyimide second stage cure is performed for five minutes at 200° C. This will cross-link the polyimide to a sufficient degree that it will not be significantly attacked by basic reagents. As used herein the term fully cured polyimide refers to polyimide material which is sufficiently cross-linked to prevent etching by basic reagents. However, as explained above, after the initial etch a very thin layer of about 1 to 2 microns of disturbed material is left around the vias which has absorbed the basic reagent, but which was not removed by the etching operation. The polyimide second stage cure at 200° C. for five minutes does not affect this material in that it does not cross-link but remains essentially a jelly-like consistency, and, as explained above, will not provide topography suitable for reliable interconnection and metal adherence. Therefore, a second etching operation is applied using the same 15 g/l KOH reagent at 50° for five minutes. This will remove the 1 to 2 micron thick disturbed material, but it will not attach the polyimide which has been additionally cured.

After the second etch the photoresist is removed, preferably using J100 which is a photoresist remover sold by Indust-Ri-Chem Laboratories of Richardson, Tex. 75080. Following the removal of the resist the coated substrate is then given a third stage cure at 350° C. for 30 minutes. This is a stabilizing treatment to insure mechanical and chemical stability of the film.

Following this third stage curing the necessary metal is deposited in the vias and applied to the top of the cured polyimide.

It is to be understood that the described sequential steps and materials used represent the preferred embodiment, but other reagents and process sequences can be utilized. For example, sodium hydroxide or tetra methyl ammonium hydroxide as well as other strong bases could be used for the etchant. Also, the process has been described which utilizes negative photoresist techniques but positive photoresist techniques can be used as well in which case a single etchant could be used for both the photoresist and the underlying partially cured polyimide. But in any event the second etch would still take place after the polyimide is additionally cured. Further modifications of the process according to conventional processing can also be made.

What is claimed is:

1. A method of etching an opening in polyimide material wherein the polymide material is provided in a sufficiently uncured condition to permit etching by a basic etchant, and wherein a selected location of the uncured polyimide is exposed for etching the opening, the improvement comprising:

etching said polyimide at the desired location with a basic reagent to provide the opening in the polyimide, some of said etchant being absorbed by a layer of polyimide material surrounding said opening but remaining in place, curing the polyimide to a sufficient extent to prevent any etching of the polyimide free of absorbed etchant, and etching the exposed location a second time with a basic reagent and remove the layer of polyimide having absorbed etchant, whereby the material surrounding the opening after the second etch is rednered free of absorbed etchant.

2. The invention as defined in claim 1 wherein the reagent is selected from the group potassium hydroxide, sodium hydroxide, and tetra methyl ammonium hydroxide.

3. The invention as defined in claim 2 wherein the reagent is potassium hydroxide.

4. The invention as defined in claim 1 wherein the polyimide is a film on a substrate material.

5. The invention as defined in claim 4 wherein a plurality of vias are etched in said polyimide to expose the substrate.

6. The invention as defined in claim 1 wherein the reagent used for the second etch is the same as the reagent used for the first etch.

* * * * *